US006545353B2

(12) United States Patent
Mashino

(10) Patent No.: US 6,545,353 B2
(45) Date of Patent: Apr. 8, 2003

(54) MULTILAYER WIRING BOARD AND SEMICONDUCTOR DEVICE

(75) Inventor: Naohiro Mashino, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/848,799

(22) Filed: May 4, 2001

(65) Prior Publication Data

US 2001/0038145 A1 Nov. 8, 2001

(30) Foreign Application Priority Data

May 8, 2000 (JP) ........................................ 2000-134703

(51) Int. Cl.[7] .............................................. H01L 23/34
(52) U.S. Cl. ...................... 257/724; 257/700; 257/707; 257/723; 257/706
(58) Field of Search ................................ 257/707, 700, 257/701, 706, 711, 723, 724, 725

(56) References Cited

U.S. PATENT DOCUMENTS

| | | | | |
|---|---|---|---|---|
| 4,963,697 A | * | 10/1990 | Peterson et al. | 174/252 |
| 5,315,072 A | * | 5/1994 | Arai et al. | 174/262 |
| 5,590,461 A | * | 1/1997 | Ishida | 29/830 |
| 5,973,929 A | * | 10/1999 | Arakawa et al. | 361/762 |
| 6,127,633 A | * | 10/2000 | Kinoshita | 174/259 |
| 6,310,391 B1 | * | 10/2001 | Nagasawa et al. | 257/707 |
| 6,392,898 B1 | * | 5/2002 | Asai et al. | 257/700 |

* cited by examiner

Primary Examiner—David Nelms
Assistant Examiner—Andy Huynh
(74) Attorney, Agent, or Firm—Paul & Paul

(57) ABSTRACT

A multilayer wiring board comprises: a metal substrate as a core, a condenser dielectric layer formed to cover the metal layer, and a condenser electrode metal layer formed to cover the condenser dielectric layer, so that a condenser is defined by the metal substrate, the condenser dielectric layer and the condenser electrode metal layer. Integral with the structure of the wiring board is a discrete capacitor component with the metal substrate and the condenser electrode forming the two plates thereof with the dielectric layer there between. The condenser dielectric layer is provided with a first contact hole to communicate with the metal substrate and the condenser electrode metal layer is provided with a second contact hole to communicate with the first contact hole, the diameter of the second contact hole being larger than that of the first contact hole. An insulating layer is formed on the condenser electrode metal layer and is provided with a via hole to communicate with the metal substrate through the second and first contact holes. A metal substrate contact metal layer formed on an inner wall of the via hole, so that the metal substrate contact metal layer comes into electrical contact with the metal substrate.

6 Claims, 6 Drawing Sheets

MULTILAYER WIRING BOARD AND SEMICONDUCTOR DEVICE

BACKGROUND OF THE INVENTION

1. Field of the Invention

The present invention relates to a multilayer wiring board. More particularly, the present invention relates to a multilayer wiring board inside which a condenser structure is composed and also relates to a method of manufacturing the multilayer wiring board. Further, the present invention relates to a semiconductor device into which the multilayer wiring board is incorporated and also relates to a method of manufacturing the semiconductor device.

2. Description of the Related Art

Recently, the density of electronic equipment has been highly increased. Accordingly, a multilayer wiring board in which a plurality of wiring layers are laminated together has been realized. A multilayer wiring board of the prior art is shown in FIG. 6.

The multilayer wiring board 201 of the prior art, shown in FIG. 6, includes a core base material 202 made of insulating material such as glass-epoxy resin or ceramics. On both sides of the core base material 202, there are provided a plurality of wiring layers 203, 203, . . . and a plurality of interlayer insulating layers 204, 204, . . . which are alternately laminated on each other. In this structure, the core base material 202 is provided for enhancing the mechanical strength of the entire multilayer wiring board 201 and also for enhancing the workability of the multilayer wiring board 201.

In this core base material 202, there are provided through-holes 202a, 202a, . . . . On the inner walls of these through-holes 202a, 202a, . . . , there are provided copper plating layers. Due to these copper plating layers, the wiring layers 203, 203 provided on both sides of the core base material can be electrically connected to each other.

Although not shown in FIG. 6, among these wiring layers 203, 203, . . . , there are provided an electric power supply layer for supplying electric power to the semiconductor element 206 to be mounted and a signal layer for inputting and outputting a signal to and from the semiconductor element 206.

On this multilayer wiring board 201 of the prior art, the semiconductor element 206 is mounted via the solder bumps 207. A semiconductor device, in which the semiconductor element 206 is mounted on the multilayer wiring board 201, is mounted on a board (not shown) such as a mother board via the solder bumps 205.

In this connection, it is common that a chip condenser (not shown) for decoupling is mounted on the multilayer wiring board 201 so that fluctuation in electric potential of the electric power supply layer, and the cross talk caused between the signal layers, can be reduced. Both electrodes of this chip condenser are respectively connected with the wiring layers to be decoupled. In this case, it is preferable that the length of the wiring between the chip condenser and the wiring layer is as short as possible. The reason is that when the length of the wiring between the chip condenser and the wiring layer is long, the impedance is increased, so that it becomes difficult for the chip condenser to accomplish the above object. Especially when the drive rate of the semiconductor element 206 is increased, the impedance is remarkably increased. Therefore, it becomes impossible to increase the operation rate of the semiconductor device composed of the multilayer wiring board 201 and the semiconductor element 206.

From the above viewpoint, it is conventional practice that the chip condenser is embedded in the interlayer insulating layer 204 so that the length of the wiring between the chip condenser and the wiring layer 203 can be reduced.

However, when the chip condenser is embedded in the interlayer insulating layer 204 as described above, it becomes necessary that the film thickness of the interlayer insulating layer 204 is larger than the thickness of the chip condenser. Therefore, it becomes impossible to reduce the film thickness of the interlayer insulating layer. When the film thickness of the interlayer insulating layer is large, it is impossible to fulfill the recent requirements that the total thickness of the multilayer wiring board 201 should be reduced so as to provide a semiconductor device of high density. Further, when the film thickness is large, the cost of the interlayer insulating layer 204 is raised. Therefore, the manufacturing cost of the multilayer wiring board 201 is increased.

Further, irregularities corresponding to the profile of the chip condenser are formed on the surface of the interlayer insulating layer 204. Therefore, it is impossible to manufacture a multilayer wiring board 201, the surface of which is flat.

SUMMARY OF THE INVENTION

The present invention has been accomplished to solve the above problems.

It is an object of the present invention to provide a multilayer wiring board inside which a condenser structure is composed so that it unnecessary to provide a chip condenser in the multilayer wiring board.

According to the present invention, there is provided a multilayer wiring board comprising: a metal substrate as a core; a condenser dielectric layer formed to cover the metal layer; and a condenser electrode metal layer formed to cover the condenser dielectric layer, so that a condenser is defined by the metal substrate, the condenser dielectric layer and the condenser electrode metal layer.

According to the multilayer wiring board of the present invention, the multilayer wiring board includes a metallic base material (metal substrate) which composes a core. The surface of this metallic base material is covered with a dielectric layer for a condenser. Further, the surface of this dielectric layer for a condenser is covered with a metallic layer for a condenser electrode.

The metallic base material, the dielectric layer for a condenser and the metallic layer for a condenser electrode compose a condenser. That is, the metallic base material and the metallic layer for a condenser electrode function as both electrode plates of the condenser, and the dielectric layer for a condenser functions as a dielectric member interposed between them.

The condenser dielectric layer is provided with a first contact hole to communicate with the metal substrate.

The condenser electrode metal layer is provided with a second contact hole to communicate with the first contact hole, the diameter of the second contact hole being larger than that of the first contact hole. An insulating layer is formed on said condenser electrode metal layer and is provided with a via hole to communicate with the metal substrate through the second and first contact holes. A metal substrate contact metal layer is formed on an inner wall of the via hole, so that the metal substrate contact metal layer comes into electrical contact with the metal substrate.

According to such a multilayer wiring board of the present invention, the first contact hole communicating with the metallic base material is formed on the condenser dielectric layer. The second contact hole communicating with the first contact hole, the diameter of the second contact hole being larger than that of the first contact hole, is formed on the metallic layer for a condenser electrode.

According to the above structure, the side wall of the second contact hole and the surface of the metallic base material exposed to the bottom of the first contact hole are separate from each other by the peripheral edge section of the first contact hole. Therefore, even when foreign objects such as particles enter the first and the second contact holes, it is difficult for the metallic layer for a condenser and the metallic base material to be short-circuited with each other. Therefore, the reliability of insulation between the metallic layer for a condenser electrode and the metallic base material can be enhanced.

The condenser dielectric layer is an oxidized layer of a surface of the metal substrate. The metal layer is made of aluminum (Al) and the condenser dielectric layer is made of aluminum oxide. Otherwise, the metal layer can be made of titanium (Ti) and the condenser dielectric layer can be made of titanium oxide.

According to another aspect of the present invention, there is provided a method for manufacturing a multiplayer wiring board, the method comprising the steps of forming a dielectric layer on a surface of a metal substrate as a core and forming a condenser electrode metal layer to cover the condenser dielectric layer, so that a condenser is defined by said metal substrate, the condenser dielectric layer and the condenser electrode metal layer.

According to still another aspect of the present invention, there is provided a method for manufacturing a multilayer wiring board, said method comprising the following steps of: forming a dielectric layer on a surface of a metal substrate as a core; forming a condenser electrode metal layer to cover the condenser dielectric layer; providing the condenser electrode metal layer with a second contact hole; providing the condenser dielectric layer at an area in the second contact hole with a first contact hole to communicate with the metal substrate, the diameter of the first contact hole being smaller than that of the second contact hole; forming an insulating layer on the condenser electrode metal layer; providing the insulating layer with a via hole to communicate with the metal substrate through the second and first contact holes; and forming a metal substrate contact metal layer on an inner wall of the via hole, so that the metal substrate contact metal layer comes into electrical contact with the metal substrate.

BRIEF DESCRIPTION OF THE DRAWINGS

FIG. 2(*b*) is an enlarged cross-sectional view showing portion B in FIG. 2(*a*);

DETAILED EXPLANATION OF THE PREFERRED EMBODIMENTS (1) Explanation of Multilayer Wiring Board of an Embodiment of the Present Invention Next, a multilayer wiring board of an embodiment of the present invention will be explained referring to FIG. 1.

Figure 6:
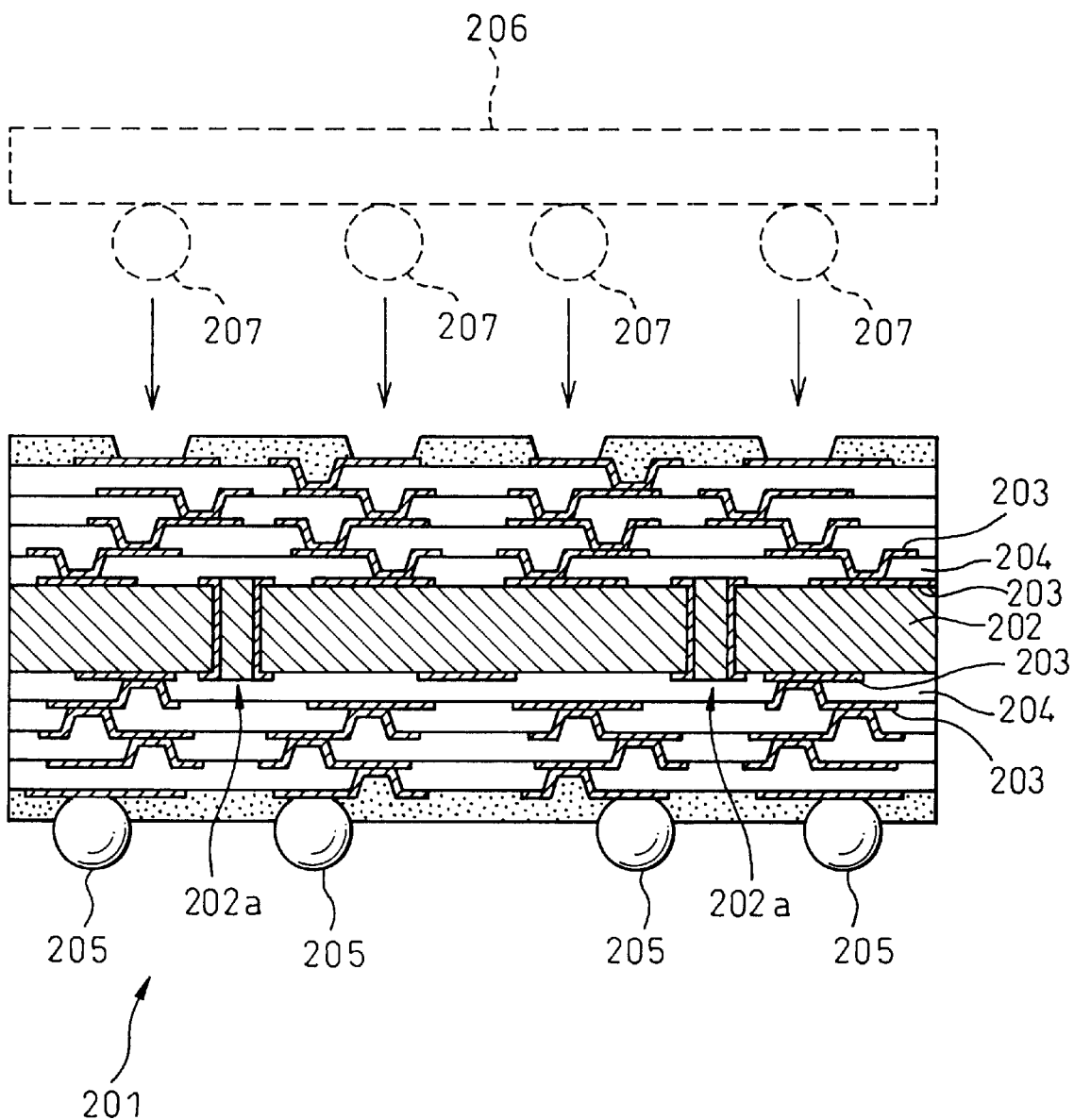
FIG. 6 is a cross-sectional view showing a multilayer wiring board of the prior art.

The multilayer wiring board 101 of the embodiment of the present invention is composed in such a manner that a plurality of interlayer insulating layers 105, 105, . . . and a plurality of wiring layers 106, 106, . . . are alternately laminated on each other in an upper and a lower portion of the aluminum base material (metallic base material) 102. In this structure, the aluminum base material (metallic base material) 102 has a function of a core for increasing the mechanical strength of the entire multilayer wiring board 101. This function is the same as the function of the core base material (metal substrate) 202 of the conventional multilayer wiring board 201 shown in FIG. 6. Due to the foregoing, the workability of the multilayer wiring board 101 can be enhanced.

The interlayer insulating layers 105, 105, . . . are made of, for example, a photosensitive polyimide resin, a non-photosensitive polyimide resin or an epoxy resin. On these interlayer insulating layers 105, 105, . . . , there are provided via holes 105*a*, 105*a*, . . . . By the copper layers formed on the inner walls of these via holes 105*a*, 105*a*, . . . , the wiring layers 106, 106, . . . , which are vertically adjacent to each other, are electrically connected with each other. In this connection, the wiring layers 106, 106, . . . are composed in such a manner that non-electrolytic copper plating layers or electrolytic copper plating layers are subjected to patterning.

On the uppermost wiring layer 106*a*, which is one of the wiring layers 106, 106, . . . , there are provided electrode pads 106*b*, 106*b*, . . . to which the solder bumps 109, 109, . . . of the semiconductor element 108 to be mounted are attached. Under the condition that the solder bumps 109, 109, . . . are attached to the electrode pads 106*b*, 106*b*, . . . , the solder bumps 109, 109, . . . are made to reflow and are then cooled. Due to the foregoing, the semiconductor element 108 and the multilayer wiring board 101 are electrically and mechanically connected with each other.

In this connection, solder resist 110 is coated on the uppermost wiring layer 106*a*, so that the solder bumps 109, 109, . . . , which have been made to reflow, are prevented from spreading to a region except for the electrode pads 106*b*, 106*b*, . . . . Although not shown in the drawing, when an under-filling agent is made to flow between the semiconductor element 108 and the solder resist 110, it becomes possible to reduce an intensity of stress acting between the semiconductor element 108 and the wiring board 101.

On the wiring board 101 composed as described above, the electrode pads 106*d*, 106*d*, . . . are formed on the lowermost wiring layer 106*c*. The solder bumps 107, 107, . . . are formed on these electrode pads 106*d*, 106*d*, . . . . In the same manner as that of the uppermost wiring layer 106*a*, solder resist 110 is coated on the lowermost wiring layer 106*c*, so that the solder bumps 107, 107, . . . , which have been made to reflow, are prevented from spreading to a region except for the electrode pads 106*d*, 106*d*, . . . . The solder bumps 107, 107, . . . function as the external connection terminals of the multilayer wiring board 101 and electrically and mechanically connect the mother board (not shown) with the multilayer wiring board 101.

In this semiconductor device, the solder bumps 107, 107, . . . are used as the external connection terminals. Therefore, the semiconductor device, in which the semiconductor element 108 is mounted on the multilayer wiring board 101, is of the BGA (Ball-Grid-Array) type. However, it should be noted that the present invention is not limited to the above specific embodiment. The same action and effect as those explained below can be provided by the semiconductor device of the PGA (Pin-Grid-Array) type in which metallic pins are used instead of the solder bumps 107, 107, . . . .

Figure 1:
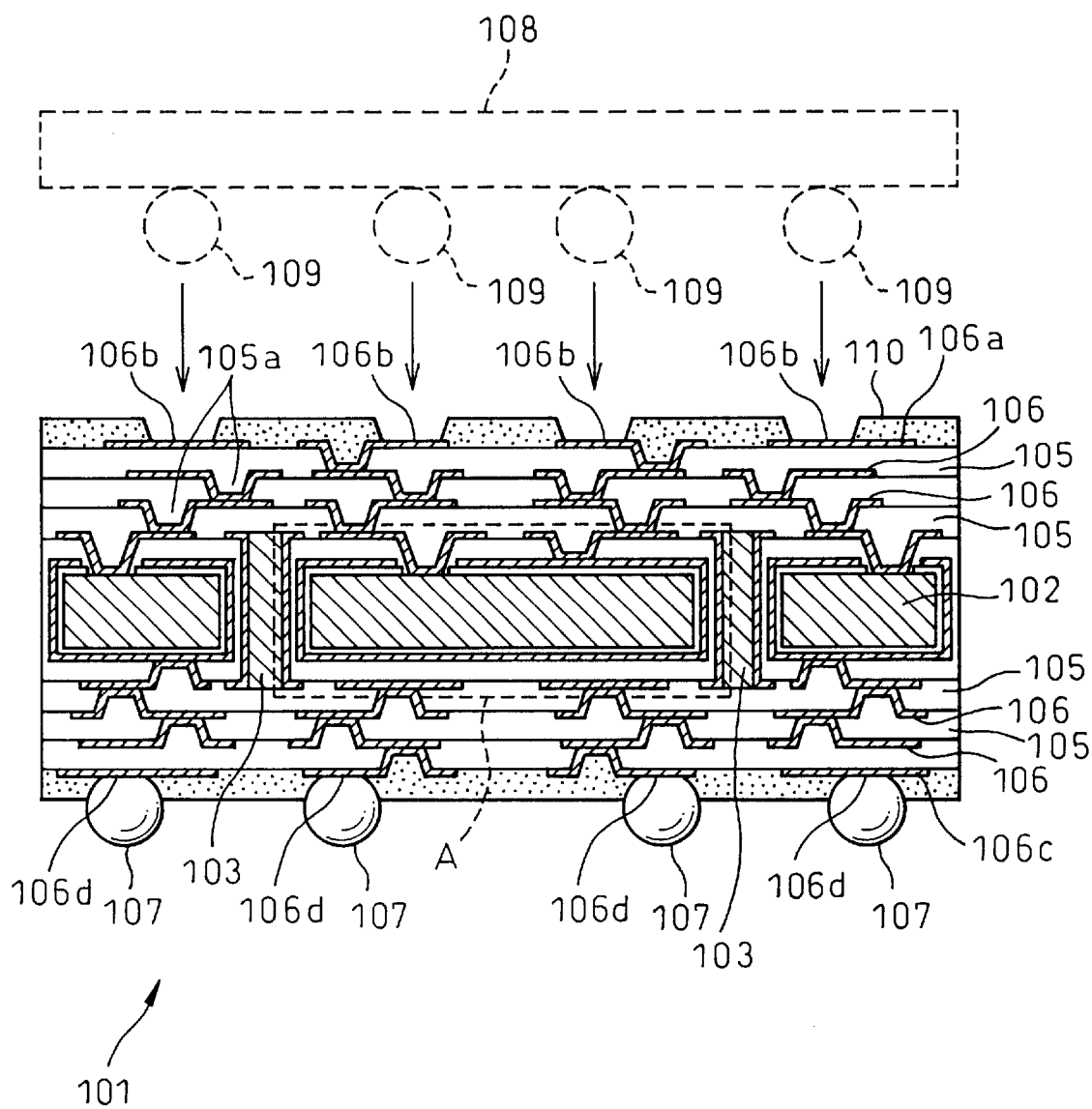
FIG. 1 is a cross-sectional view showing a multilayer wiring board of an embodiment of the present invention.
Figure 2A:
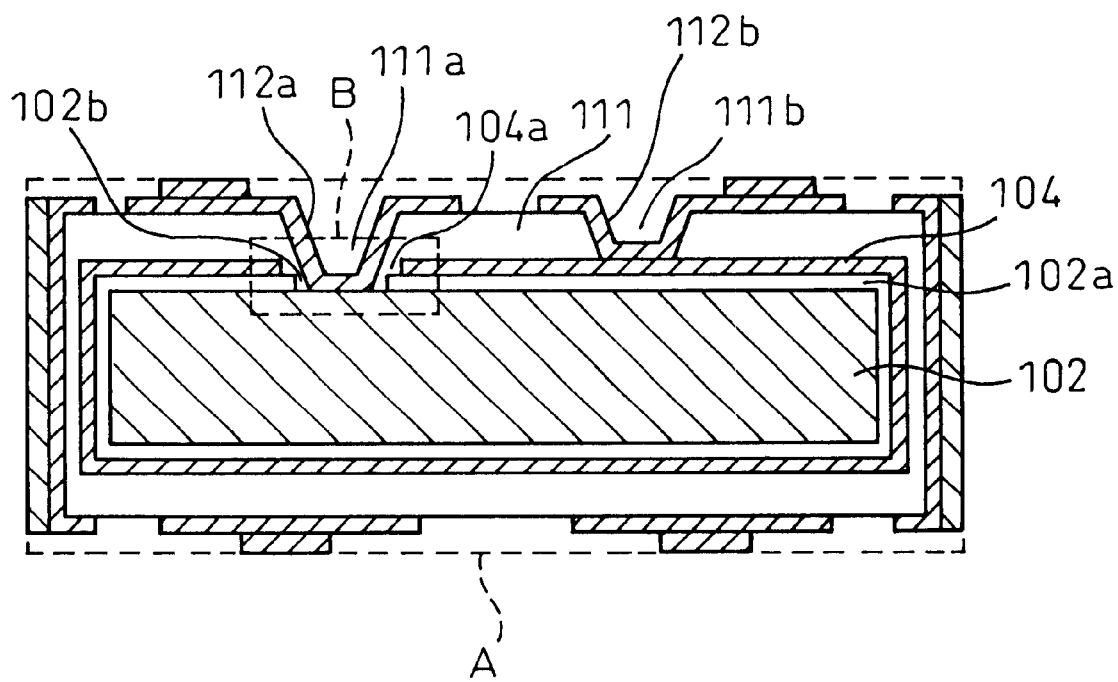
FIG. 2(*a*) is an enlarged cross-sectional view showing a primary portion of a multilayer wiring board of an embodiment of the present invention.

Referring to FIG. 2(a), a primary portion of the multilayer wiring board 101 will be explained below. FIG. 2(a) is an enlarged cross-sectional view showing a primary portion of a multilayer wiring board of an embodiment of the present invention, that is, FIG. 2(a) is a view in which portion A in FIG. 1 is enlarged.

As shown in FIG. 2(a), on the surface of the aluminum base material 102, there is provided a dielectric layer 102a for a condenser made of alumina ($Al_2O_3$). Further, on the surface of the dielectric layer 102a for a condenser, there is provided a copper plating layer 104 for a condenser electrode (metallic layer for a condenser electrode). In this embodiment, the thickness of the aluminum base material 102 is approximately 100 to 800 $\mu$m, and the film thickness of the dielectric layer for a condenser is not more than 10 $\mu$m. The film thickness of the copper plating layer 104 for a condenser electrode is several $\mu$m to 30 $\mu$m.

It should be noted that the condenser structure is composed of the aluminum base material 102, the dielectric layer 102a for a condenser and the copper layer 104 for a condenser electrode. That is, the aluminum base material 102 and the copper plating layer 104 for a condenser function as both electrode plates of the condenser, and the dielectric layer 102a for a condenser functions as a dielectric body of the condenser.

Accordingly, for example, when the electric power supply layer in the wiring layers 106, 106, . . . (shown in FIG. 1) and the aluminum base material 102 are connected with each other and when the ground layer in the wiring layers 106, 106, . . . and the copper plating layer 104 for a condenser electrode are connected with each other, it is possible to provide a structure in which a condenser is inserted between the electric power supply layer and the ground layer. Therefore, it becomes possible to decouple the electric power supply layer and the ground layer from each other. In the same manner, when two wires, which are signal lines, are respectively connected with the aluminum base material 102 and the copper plating layer 104 for a condenser electrode, it becomes possible to decouple the signal lines from each other.

As described above, on the multilayer wiring board 101 of this embodiment, the condenser structure is composed inside the multilayer wiring board 101. Therefore, the length of wiring between the signal lines, which are an object of decoupling, and the condenser can be shortened. Accordingly, even if the operation rate of the semiconductor element 108 is increased, it is possible to suppress an increase in the impedance caused by the length of wiring between the condenser and the signal line. Therefore, the condenser capacitance can be fully utilized. Due to the foregoing, it becomes possible to drive the semiconductor element 108 at a high rate and the occurrence of cross talk between the signal lines on the multilayer wiring board 101 can be suppressed. In this way, the semiconductor device in which the semiconductor element 108 is mounted on the multilayer wiring board 101 can be operated at a high operation rate.

Concerning the multilayer wiring board 101 of this embodiment, the condenser is composed inside the multilayer wiring board 101. Therefore, it is unnecessary to embed a chip condenser in the interlayer insulating layer 105 as in the conventional multilayer wiring board. Therefore, it becomes unnecessary that the film thickness of the interlayer insulating layer 105 is increased to be larger than the thickness of the chip condenser. Accordingly, the film thickness of the interlayer insulating layer 105 can be reduced to a predetermined value. Due to the foregoing, the total thickness of the multilayer wiring board 101 can be reduced to be smaller than that of the prior art. For the above reasons, it becomes possible to reduce the size of the semiconductor device in which the semiconductor element 108 is mounted on the multilayer wiring board 101. In addition to that, the film thickness of the interlayer insulating layer 105 can be reduced, so that the manufacturing cost of the interlayer insulating layer 105 can be also reduced. As a result, the manufacturing cost of the multilayer wiring board 101 can be reduced.

In this embodiment, the aluminum base material 102 is used as a core. When the aluminum base material 102 is compared with the conventional core base material 202 (shown in FIG. 6) made of resin or ceramics, the mechanical strength of the aluminum base material 102 is higher than that of the conventional core base material 202. Therefore, it is possible to reduce the thickness of the aluminum base material 102 to be smaller than the thickness of the core base material 202. Due to the foregoing, the entire thickness of the multilayer wiring board 101 can be reduced to be smaller than that of the prior art.

In this connection, the aluminum base material 102 and the copper plating layer 104 for a condenser electrode must be connected with the electric power supply layer, ground layer and signal layer as described before. In order to connect the aluminum base material 102 and the copper plating layer 104 with the electric power supply layer, ground layer and signal layer, contact holes are formed on the dielectric layer 102a for a condenser and the copper plating layer 104 for a condenser so that the wiring can be laid out from the aluminum base material 102 and the copper plating layer 104 for a condenser electrode. These points will be explained as follows.

First, the wiring laid out from the aluminum base material 102 will be explained. In order to lay out the wiring from the aluminum base material 102, the first contact hole 102b is formed on the dielectric layer 102a for a condenser. The second contact hole 104a, which is communicated with the first contact hole 102b, is formed on the copper plating layer 104 for a condenser electrode.

On the copper plating layer 104 for a condenser electrode, there is provided an insulating layer 111. On this insulating layer 111, there is provided a via hole 111a for a metallic base material contact which passes in the second contact hole 104a and the first contact hole 102b and communicates with the aluminum base material 102.

On the inner wall of the via hole 111a for a metallic base material contact, there is provided a copper plating layer 112a for a metallic material base contact (metallic layer for a metallic base material contact). The copper plating layer 112a for a metallic material base contact comes into electrical contact with the aluminum base material 102 at the bottom of the via hole 111a for a metallic base material contact.

Further, this copper plating layer 112a for a metallic base material contact is electrically connected with a desired layer on the wiring layers 106, 106, . . . via the via holes 105a (shown in FIG. 1) formed on the interlayer insulating layer 105. Accordingly, the aluminum base material 102 is electrically connected with a desired layer on the wiring layers 206, 206, . . . via the copper plating layer 112a for a metallic base material contact.

On the other hand, explanations will be made into drawing out the wiring from the copper plating layer 104 for a condenser electrode. In order to draw out the wiring from the copper layer plating layer 104, the via hole 111b is formed on the insulating layer 111. This via hole 111b is referred to as a via hole 111b for a condenser electrode contact, hereinafter. On the inner wall of this via hole 111b for a condenser electrode contact, there is provided a copper plating layer 112b for a condenser electrode contact. Therefore, the copper plating layer 112b for a condenser electrode contact is electrically contacted with the copper plating layer 104 for a condenser electrode at the bottom portion of the via hole 111b for a condenser electrode contact.

This copper plating layer 112b for a condenser electrode contact is electrically connected with a desired layer on the wiring layers 106, 106, . . . via the via hole 105a (shown in FIG. 1) provided on the interlayer insulating layer 105. Accordingly, the copper plating layer 104 for a condenser electrode is electrically connected with a desired layer on the wiring layers 206, 206, . . . via the copper plating layer 112b for a condenser electrode contact.

In this way, wiring is laid from the aluminum base material 102 and the copper plating layer 104 for a condenser electrode to the desired layer on the wiring layers 206, 206, . . . .

Figure 2B:
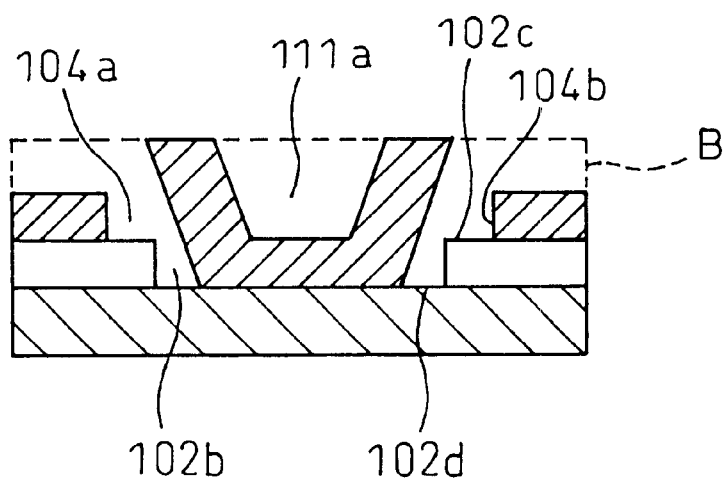

Next, referring to FIG. 2(b), the structure of the periphery of the via hole 111a for a metallic base material contact will be explained. FIG. 2(b) is an enlarged cross-sectional view of portion B in FIG. 2(a). As shown in the drawing, the diameter of the second contact hole 104a is larger than that of the first contact hole 102b.

Therefore, as shown in the drawing, the side wall 104b of the second contact hole 104a and the aluminum base material 102d exposed to the bottom portion of the first contact hole 102b are separated from each other by the peripheral edge section 102c of the first contact hole 102b. Accordingly, even if foreign objects such as particles get into the first contact hole 102b and the second contact hole 104a in the manufacturing process of the multilayer wiring board 101, it is difficult for the foreign objects to simultaneously come into contact with both the side wall 104b and the aluminum base material 102d. Therefore, the copper plating layer 104 for a condenser electrode and the aluminum base material 102 are seldom short-circuited with each other. Due to the foregoing, the reliability of the insulation between the layers can be enhanced.

In this connection, in this embodiment, the condenser composed in the manner described above is used as a condenser for decoupling, however, it should be noted that the present invention is not limited to the above specific embodiment. For example, the above condenser can be used as a condenser for adjusting the entire impedance of the multilayer wiring board 101.

(2) Explanation of a Method of Manufacturing Multilayer Wiring Board of the Embodiment of Present Invention Referring to FIGS. 3(a) to 3(d), 4(a) to 4(d) and 5, a method of manufacturing the multilayer wiring board 101 of the above embodiment will be explained as follows. FIGS. 3(a) to 3(d), 4(a) to 4(d) and 5 are cross-sectional views showing the method of manufacturing the multilayer wiring board of this embodiment.

Figure 3A:
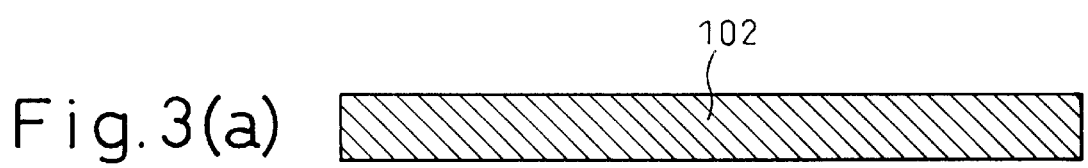
FIGS. 3(*a*) to 3(*d*) are cross-sectional views showing a method of manufacturing a multilayer wiring board of an embodiment of the present invention.

First, as shown in FIG. 3(a), the aluminum base material (metal substrate) 102, the thickness of which is about 100 to 800 μm, is prepared.

Figure 3B:
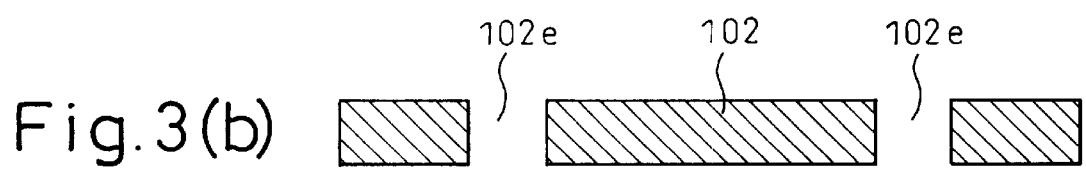

Next, as shown in FIG. 3(b), the through-holes 102e, 102e, . . . are formed in the aluminum base material 102 by means of wet-etching or punching. When the means of wet-etching or punching is adopted, a plurality of through-holes 102e, 102e, . . . can be simultaneously formed. On the other hand, in the case of the multilayer wiring board 201 (shown in FIG. 6) of the prior art, since the core base material 202 made of resin or ceramics is used, it is impossible to form the through-holes 202a, 202a, . . . by means of wet-etching or punching as in the embodiment of the present invention. For the above reasons, it is conventional that the through-holes 202a, 202a, . . . are formed by a mechanical drill instead of the means of wet-etching or punching. However, when the mechanical drill is used, it is impossible to simultaneously form a plurality of through-holes 202a, 202a, . . . that is, the through-holes 202a, 202a, . . . must be formed one by one. Accordingly, it takes a long time to form the through-holes. In addition to that, the cost of machining conducted by the mechanical drill is higher than that conducted by wet-etching or punching.

As can be seen in the above explanation, when the aluminum base material 102 is used, it is possible to form the through-holes 102e, 102e, . . . in a shorter period of time compared with the prior art.

Figure 3C:
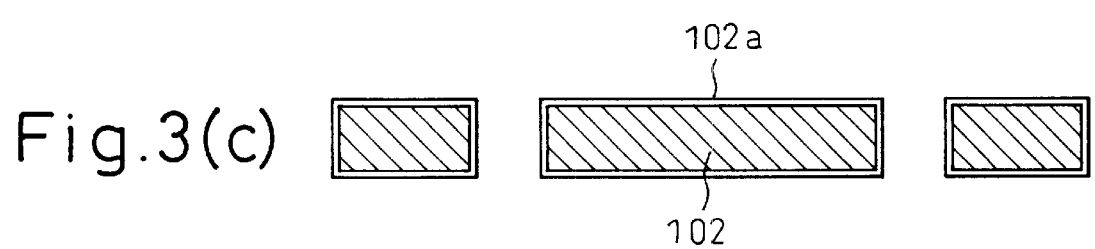

After the through-holes 102e, 102e, . . . have been formed in this way, the process shown in FIG. 3(c) is carried out. In the process shown in FIG. 3(c), the surface of the aluminum base material 102 is subjected to oxygen-plasma treatment so that the surface layer is oxidized, that is, the surface layer is turned into a dielectric body layer 102a for a condenser made of $Al_2O_3$. Alternatively, when this oxygen-plasma treatment is not used but powder made of $Al_2O_3$ is deposited on the surface of the aluminum base material 102 and fired, the dielectric body layer 102a, for a condenser, made of $Al_2O_3$ can be formed.

In any of the above cases, in order to prevent the layer of $Al_2O_3$ from peeling off, the surface of the dielectric layer 102a for a condenser may be coated with resin. As explained before, the film thickness of this dielectric body layer for a condenser is not more than 10 μm.

In place of the alumina base material, a titanium base material can be used as a metallic base material 102. In this case, a surface of the titanium (Ti) base material 102 is oxidized to form titanium oxide ($TiO_2$) as a dielectric body layer 102 on the surface of the titanium base material 102.

Figure 3D:
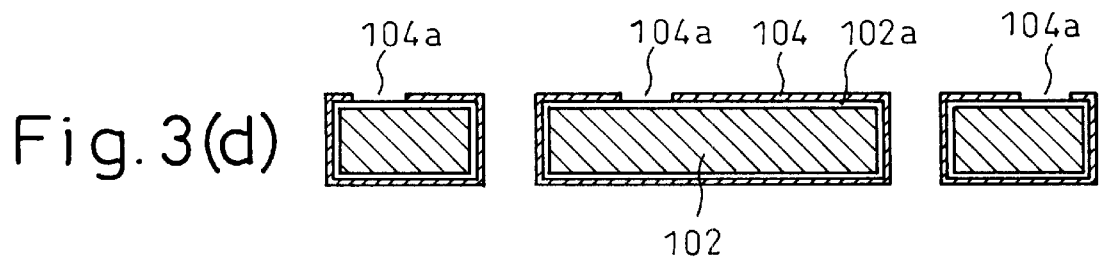

Successively, as shown in FIG. 3(d), the copper plating layer 104 for a condenser electrode, on which the second contact holes 104a, 104a, . . . are provided, are formed on the surface of the dielectric layer 102a for a condenser. When this copper plating layer 104 for a condenser electrode is formed, the full-additive method or semi-additive method is used.

In the case where the full-additive method is used, after the surface of the dielectric layer 102a for a condenser has been changed into catalyst, a plating-resist (not shown) is coated at positions corresponding to the second contact holes 104a, 104a . . . on the surface. A portion not coated with this plating-resist is subjected to non-electrolytic copper plating, and then the plating-resist is peeled off. In this way, the copper plating layer 104 for a condenser electrode is completed.

On the other hand, in the case where the semi-additive method is used, after a thin non-electrolytic copper plating layer (not shown) has been formed on the entire surface of the dielectric layer 102a for a condenser, a plating-resist (not shown) is coated at positions corresponding to the second contact holes 104a, 104a . . . on the surface. After that, the non-electrolytic copper plating layer, which has been formed before, is used as an electric power supply layer, and an electrolytic copper plating layer is formed on the non-electrolytic copper plating layer in a portion not coated with the plating-resist. Finally, the plating-resist is peeled off, and the non-electrolytic copper plating layer, which has been formed below the plating-resist, is removed by means of etching. In this way, the copper plating layer 104 for a condenser electrode is completed.

Figure 4A:
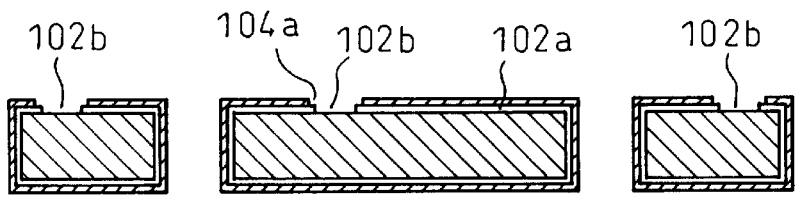
FIGS. 4(*a*) to 4(*d*) are cross-sectional views showing a method of manufacturing a multilayer wiring board of an embodiment of the present invention.

Next, as shown in FIG. 4(a), the first contact holes 102b, 102b, . . . are formed on the dielectric body layer 102a for a condenser by means of laser beam machining. As explained before, the diameter of the first contact hole 102b, 102b, . . . is smaller than that of the second contact hole 104b, 104b, . . . .

Figure 4B:
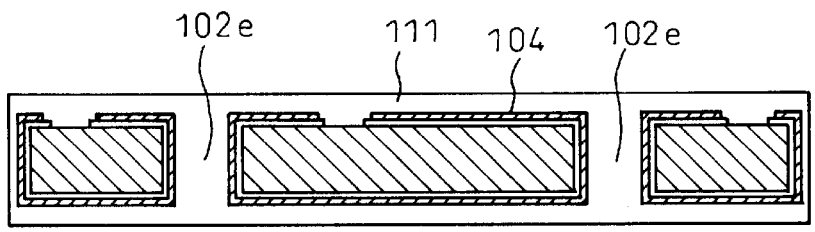

Next, as shown in FIG. 4(b), the insulating layer 111 is formed on the entire surface. For example, this insulating layer 111 is made when a photosensitive polyimide resin, a non-photosensitive polyimide resin or an epoxy resin is coated on the entire surface. Alternatively, instead of the photosensitive polyimide resin, the non-photosensitive polyimide resin and the epoxy resin, a resin sheet such as a prepreg sheet may be made to adhere onto the copper plating layer 104 for a condenser electrode so that the insulating layer 111 can be formed.

Figure 4C:
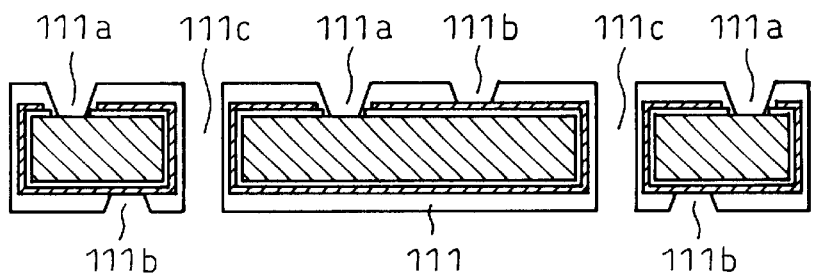

Successively, as shown in FIG. 4(c), the via holes 111a, 111a, . . . for a metallic base material contact, the via holes 111b, 111b, . . . for a condenser electrode contact and the resin through-holes 111c, 111c, . . . are formed on the insulating layer 111 as follows.

First, in the case where the insulating layer 111 is made of a photosensitive polyimide resin, these via holes and through-holes are formed when the photosensitive epoxy resin is exposed to light and developed. When the insulating layer 111 is made of a non-photosensitive resin such as a non-photosensitive polyimide resin, an epoxy resin or a prepreg, portions in which the via holes and the through-holes are to be formed are irradiated with laser beams so that these portions are removed and the holes are opened.

In this connection, the insulating layer 111 may be made by means of electrostatic coating in the process shown in FIG. 4(b). When the method of electrostatic coating is used, the surface profile of the insulating layer 111 becomes substantially the same as that of the base. Therefore, the resin through-holes 111c, 111c, . . . can be smoothly formed corresponding to the through-holes 102e, 102e, . . . . For the above reasons, when the insulating layer 111 is formed by means of electrostatic coating, it becomes unnecessary to provide a process in which the resin through-holes 111c, 111c, . . . are formed. Accordingly, the manufacturing process of the multilayer wiring board 101 can be simplified.

Figure 4D:
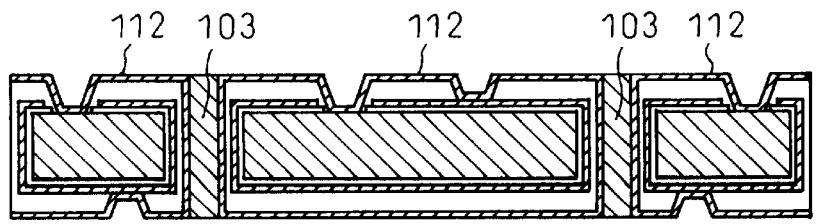

Next, as shown in FIG. 4(d), after the copper plating layer 112 has been formed on the entire surface, the resin through-holes 111c, 111c, . . . are filled with the through-hole filling resin 103.

In this case, the copper plating layer 112 is formed in such a manner that the non-electrolytic copper plating layer is formed on the entire surface and then electrolytic copper plating is conducted on the non-electrolytic copper plating layer while the non-electrolytic copper plating layer is being used as an electric power supply layer.

The through-hole filling resin 103 is filled in the resin through-holes 111c, 111c, . . . by means of screen-printing after the copper plating layer 112 has been formed as described above.

Figure 5:
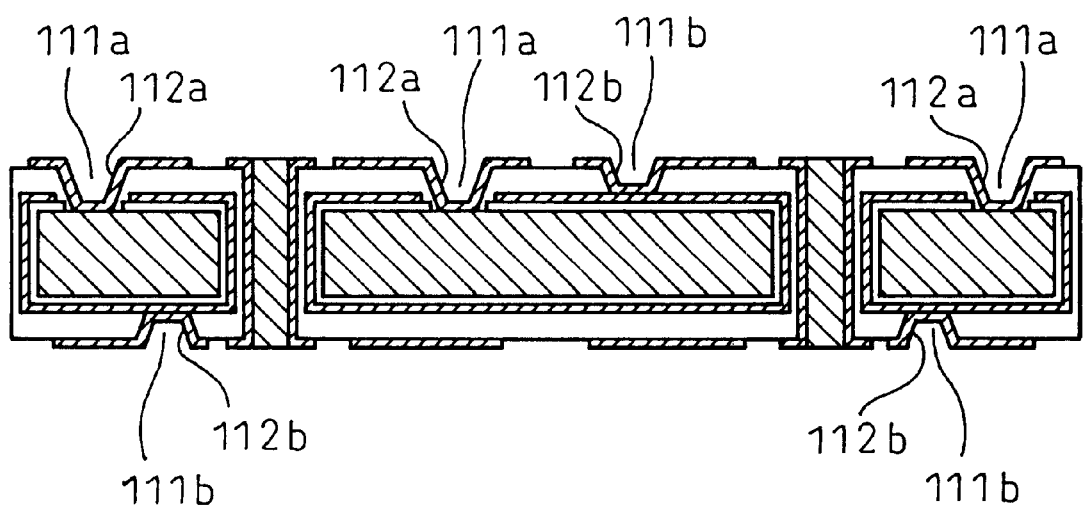
FIG. 5 is a cross-sectional view showing a method of manufacturing a multilayer wiring board of an embodiment of the present invention.

Successively, as shown in FIG. 5, the copper plating layer 112 is subjected to patterning. In the process of this patterning, the copper layers 112, which have been respectively formed on the inner walls of the via holes 111a, 111a, . . . for a metallic base material contact and the via holes 111b, 111b, . . . for a condenser electrode contact, are left and are not removed.

The copper plating layer 112 left on the inner walls of the via holes 111a, 111a, . . . for a metallic base material contact becomes the copper plating layer 112a for a metallic base material contact. In the same manner, the copper plating layer 112 left on the inner walls of the via holes 111b, 111b, . . . for a condenser electrode contact becomes the copper plating layer 112b for a condenser electrode contact.

In the manner described above, the condenser structure composing a primary portion of the multilayer wiring board of the present invention is completed. After the completion of the condenser structure, the interlayer insulating layers 105, 105, . . . and the wiring layers 106, 106 . . . are alternately laminated on each other, so that the multilayer wiring board 101 shown in FIG. 1 is completed.

As explained above, according to the multilayer wiring board of the present invention, a condenser is composed inside the multilayer wiring board. Therefore, it is unnecessary that a chip condenser is embedded in the interlayer insulating layer. Accordingly, it is possible to reduce the film thickness of the interlayer insulating layer to be smaller that that of the prior art. Due to the foregoing, the thickness of the entire multilayer wiring board can be reduced to be smaller than that of the prior art.

It will be understood by those skilled in the art that the foregoing description relates to only some preferred embodiments of the disclosed invention, and that various changes and modifications may be made to the invention without departing the sprit and scope thereof.

What is claimed is:

1. A multilayer wiring board having a condenser element formed as a part thereof, comprising: a metal substrate as a core;

a condenser dielectric layer formed to cover said metal layer; and a condenser electrode metal layer formed to cover said condenser dielectric layer, so that a condenser is defined by said metal substrate defining one of a pair of electrodes for said condenser element, said condenser dielectric layer and said condenser electrode metal layer defining the other electrode for said condenser element.

2. The multilayer wiring board as set forth in claim 1, wherein;

said condenser dielectric layer is provided with a first contact hole to communicate with said metal substrate;

said condenser electrode metal layer is provided with a second contact hole to communicate with said first contact hole, a diameter of said second contact hole is larger than that of said first contact hole;

an insulating layer is formed on said condenser electrode metal layer;

said insulating layer is provided with a via hole to communicate with said metal substrate through said second and first contact holes; and a metal substrate contact metal layer is formed on an inner wall of said via hole, so that said metal substrate contact metal layer comes into electrically contact with said metal substrate.

3. The multilayer wiring board as set forth in claim 1, wherein said condenser dielectric layer is an oxidized layer of a surface of said metal substrate.

4. The multilayer wiring board as set forth in claim 1, wherein said metal layer is made of aluminum (Al) and said condenser dielectric layer is made of aluminum oxide ($Al_2O_2$).

5. The multilayer wiring board as set forth in claim 1 wherein said metal layer is made of titanium (Ti) and said condenser dielectric layer is made of titanium oxide ($TiO_2$).

6. A semiconductor device comprising:

a multilayer wiring board including a metal substrate as a core; a condenser dielectric layer formed to cover said metal layer; and a condenser electrode metal layer formed to cover said condenser dielectric layer, so that a condenser element is defined by said metal substrate which forms a first electrode of said condenser element, said condenser electrode metal layer forming the other electrode of said condenser element with said dielectric layer interposed between said condenser electrodes; and a semiconductor element is mounted on said multiplayer wiring board.

\* \* \* \* \*